United States Patent
Ma et al.

(10) Patent No.: US 11,894,365 B2
(45) Date of Patent: Feb. 6, 2024

(54) POWER AMPLIFYING DEVICE

(71) Applicant: Murata Manufacturing Co., Ltd., Kyoto-fu (JP)

(72) Inventors: Shaojun Ma, Nagaokakyo (JP); Yasunari Umemoto, Nagaokakyo (JP); Kenji Sasaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 473 days.

(21) Appl. No.: 17/216,404

(22) Filed: Mar. 29, 2021

(65) Prior Publication Data

US 2021/0305949 A1 Sep. 30, 2021

(30) Foreign Application Priority Data

Mar. 30, 2020 (JP) ................. 2020-060222

(51) Int. Cl.
*H01L 27/06* (2006.01)
*H01L 49/02* (2006.01)
*H01L 29/205* (2006.01)
*H01L 29/737* (2006.01)
*H01L 23/66* (2006.01)

(52) U.S. Cl.
CPC .......... *H01L 27/0658* (2013.01); *H01L 23/66* (2013.01); *H01L 28/20* (2013.01); *H01L 28/60* (2013.01); *H01L 29/205* (2013.01); *H01L 29/7371* (2013.01); *H03F 2200/451* (2013.01)

(58) Field of Classification Search
CPC ............. H01L 27/0647; H01L 27/0652; H01L 27/0658; H01L 28/20; H01L 28/40; H01L 23/66; H01L 28/60; H01L 29/7371; H01L 27/067; H01L 27/0744; H01L 27/075; H01L 27/0755; H01L 27/0783
See application file for complete search history.

(56) References Cited

U.S. PATENT DOCUMENTS 6,403,991 B1 * 6/2002 Kurokawa .......... H01L 21/8252
257/E29.174
10,868,155 B2 * 12/2020 Sasaki ..................... H03F 3/195
(Continued)

FOREIGN PATENT DOCUMENTS

| CN | 110021595 A | 7/2019 |
| JP | 2005167605 A | 6/2005 |
| TW | 201937691 A | 9/2019 |

*Primary Examiner* — Eduardo A Rodela
(74) *Attorney, Agent, or Firm* — Studebaker & Brackett PC

(57) ABSTRACT

Multiple bipolar transistors are disposed side by side in the first direction on a substrate. Multiple first capacitance devices are provided corresponding to the respective base electrodes of the bipolar transistors. A radio frequency signal is supplied to the bipolar transistors through the first capacitance devices. Resistive devices are provided corresponding to the respective base electrodes of the bipolar transistors. A base bias is supplied to the bipolar transistors through the resistive devices. The first capacitance devices are disposed on the same side relative to the second direction orthogonal to the first direction, when viewed from the bipolar transistors. At least one of the first capacitance devices is disposed so as to overlap another first capacitance device partially when viewed in the second direction from the bipolar transistors.

20 Claims, 12 Drawing Sheets

(56) References Cited

U.S. PATENT DOCUMENTS

| | | | |
|---|---|---|---|
| 2001/0042867 A1* | 11/2001 | Furuhata | H01L 29/7371 |
| | | | 257/E29.189 |
| 2010/0032720 A1* | 2/2010 | Sasaki | H01L 29/7371 |
| | | | 257/E23.141 |
| 2013/0026541 A1 | 1/2013 | Kurokawa et al. | |
| 2017/0117857 A1* | 4/2017 | McPartlin | H01L 23/53228 |
| 2019/0214382 A1* | 7/2019 | Koya | H01L 29/0692 |
| 2021/0098585 A1* | 4/2021 | Umemoto | H01L 27/0658 |
| 2022/0059527 A1* | 2/2022 | Umemoto | H03F 3/21 |

\* cited by examiner

POWER AMPLIFYING DEVICE

CROSS-REFERENCE TO RELATED APPLICATION

This application claims benefit of priority to Japanese Patent Application No. 2020-060222, filed Mar. 30, 2020, the entire content of which is incorporated herein by reference.

BACKGROUND

Technical Field

The present disclosure relates to a power amplifying device.

Background Art

Heterojunction bipolar transistors (HBTs) are used in power amplifying circuits for radio frequency signals in portable terminals, mobile terminals, and the like, as described, for example, in Japanese Unexamined Patent Application Publication No. 2005-167605. The power amplifying circuit disclosed in Japanese Unexamined Patent Application Publication No. 2005-167605 includes multiple transistor pairs connected to each other in parallel. Each of the transistor pairs is formed of two transistors connected to each other in parallel. A capacitor and a ballast resistor are provided corresponding to each transistor pair. A radio frequency signal is input to the bases of the two transistors of the transistor pair through the capacitor. A bias current is supplied to the bases of the two transistors of the transistor pair through the ballast resistor. Since a capacitor and a ballast resistor are disposed for each transistor pair, the occupied area of the power amplifying circuit may be smaller than that in the case in which a capacitor and a ballast resistor are disposed for each transistor.

The emitter terminal of each of the HBTs has a rectangular shape in plan view. The corresponding base terminal has two main base-electrode portions disposed with the emitter terminal interposed in between in the width direction.

To satisfy the requirement specification of the fifth generation mobile communication system (5G), bipolar transistors such as HBTs need to perform a high-voltage operation. A high operating voltage exceeding a certain destruction limit may damage HBTs in a load change test on a power amplifying circuit. For example, in the power amplifying circuit described in Japanese Unexamined Patent Application Publication No. 2005-167605, a variation in current occurs between two transistors, which are included in a transistor pair, due to a variation in manufacture of the transistors. A current is concentrated more and more to a transistor through which a relatively large current flows, resulting in an unstable operation.

In addition, in a single HBT, there may be asymmetry in the relative positional relationship between the emitter terminal and the main base-electrode portions of the two base electrodes disposed on both the sides of the emitter terminal. Due to the asymmetry, a relatively large current may flow through one of the main base-electrode portions. A current is concentrated more and more to the region through which a relatively large current flows in the HBT, resulting in instability in operation. Such instability in operation causes a narrow safe operating area (SOA). This produces an adverse effect of degradation in ruggedness upon load mismatch.

In addition, devices included in a power amplifying circuit are desirably reduced in size.

SUMMARY

Accordingly, the present disclosure provides a power amplifying device that enables suppression of concentration of current to a partial range of a transistor, resulting in enlargement of an SOA.

According to preferred embodiments of the present disclosure, there is provided a power amplifying device including a plurality of bipolar transistors, a plurality of first capacitance devices, and a plurality of resistive devices. The plurality of bipolar transistors are disposed side by side in a first direction on a substrate. Each of the plurality of bipolar transistors includes a collector layer, a base layer, an emitter layer, and at least one base electrode electrically connected to the base layer. The plurality of first capacitance devices are provided corresponding to the respective base electrodes of the plurality of bipolar transistors. Each of the plurality of first capacitance devices has a first electrode and a second electrode. The first electrode is connected to the corresponding base electrode. The second electrode is supplied with a radio frequency signal. The plurality of resistive devices are provided corresponding to the respective base electrodes of the plurality of bipolar transistors. Each of the plurality of resistive devices has a first end and a second end. The first end is connected to the corresponding base electrode. The second end is supplied with a bias. The plurality of first capacitance devices are disposed on an identical side relative to a second direction when viewed from the plurality of bipolar transistors. The second direction is orthogonal to the first direction. At least one of the plurality of first capacitance devices is disposed so as to overlap a different first capacitance device partially when viewed in the second direction from the plurality of bipolar transistors.

A first capacitance device and a resistive device are disposed corresponding to each base electrode, enabling suppression of concentration of a bias current and a radio frequency current to a specific base electrode. This enables a stable operation and enlargement of an SOA. In addition, at least one of the first capacitance devices is disposed so as to overlap another first capacitance device partially when viewed in the second direction from the bipolar transistors, achieving a smaller power amplifying device than one having the configuration in which the first capacitance devices are disposed in a line in the first direction.

Other features, elements, characteristics and advantages of the present disclosure will become more apparent from the following detailed description of preferred embodiments of the present disclosure with reference to the attached drawings.

DETAILED DESCRIPTION

First Embodiment

Referring to FIGS. 1 to 6B, a power amplifying device according to a first embodiment will be described.

Figure 1:
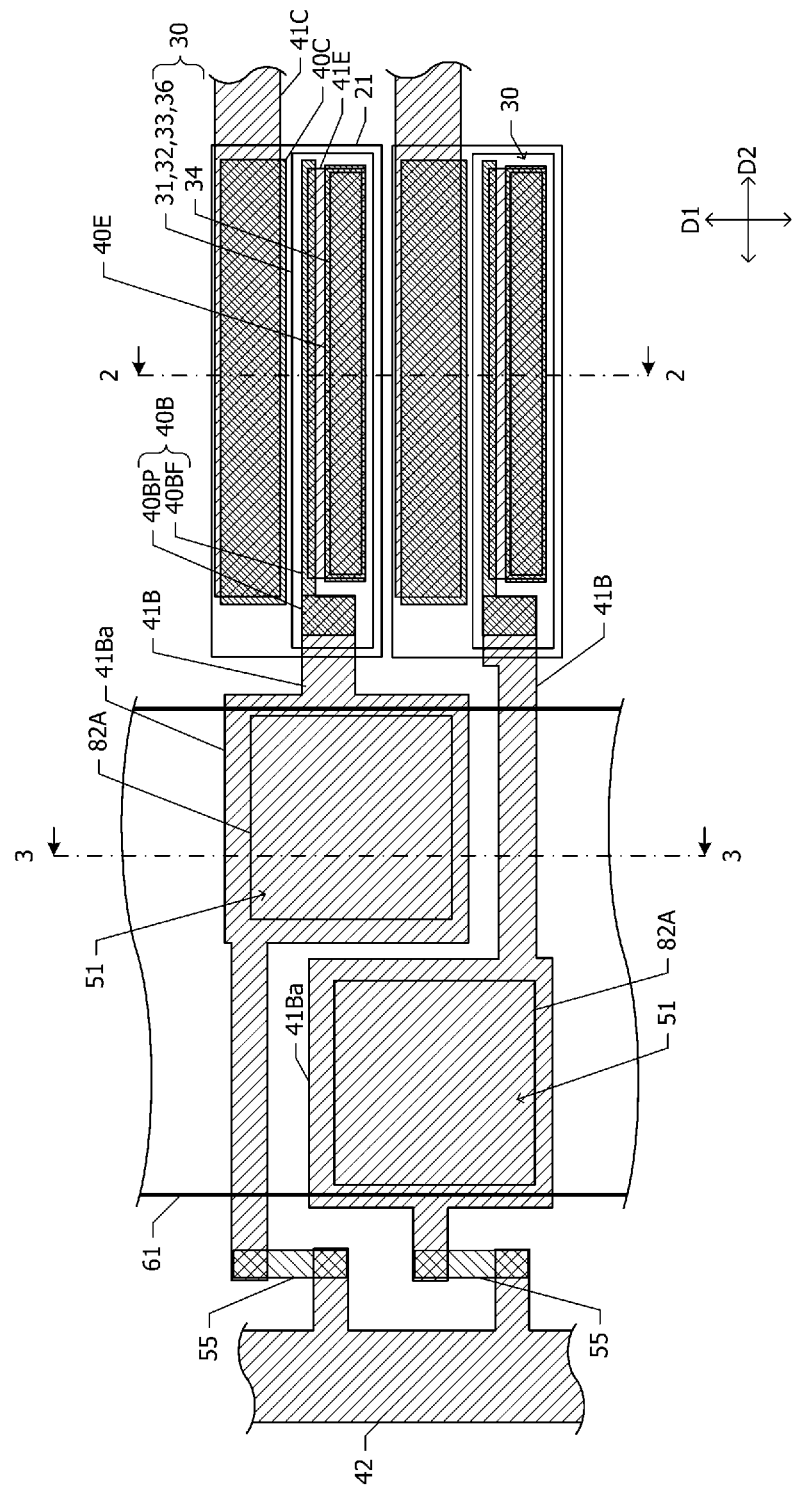
FIG. 1 is a diagram illustrating the positional relationship, in plan view, of two of the bipolar transistors included in a power amplifying device according to a first embodiment, and capacitance devices and resistive devices connected to the two bipolar transistors.
Figure 2:
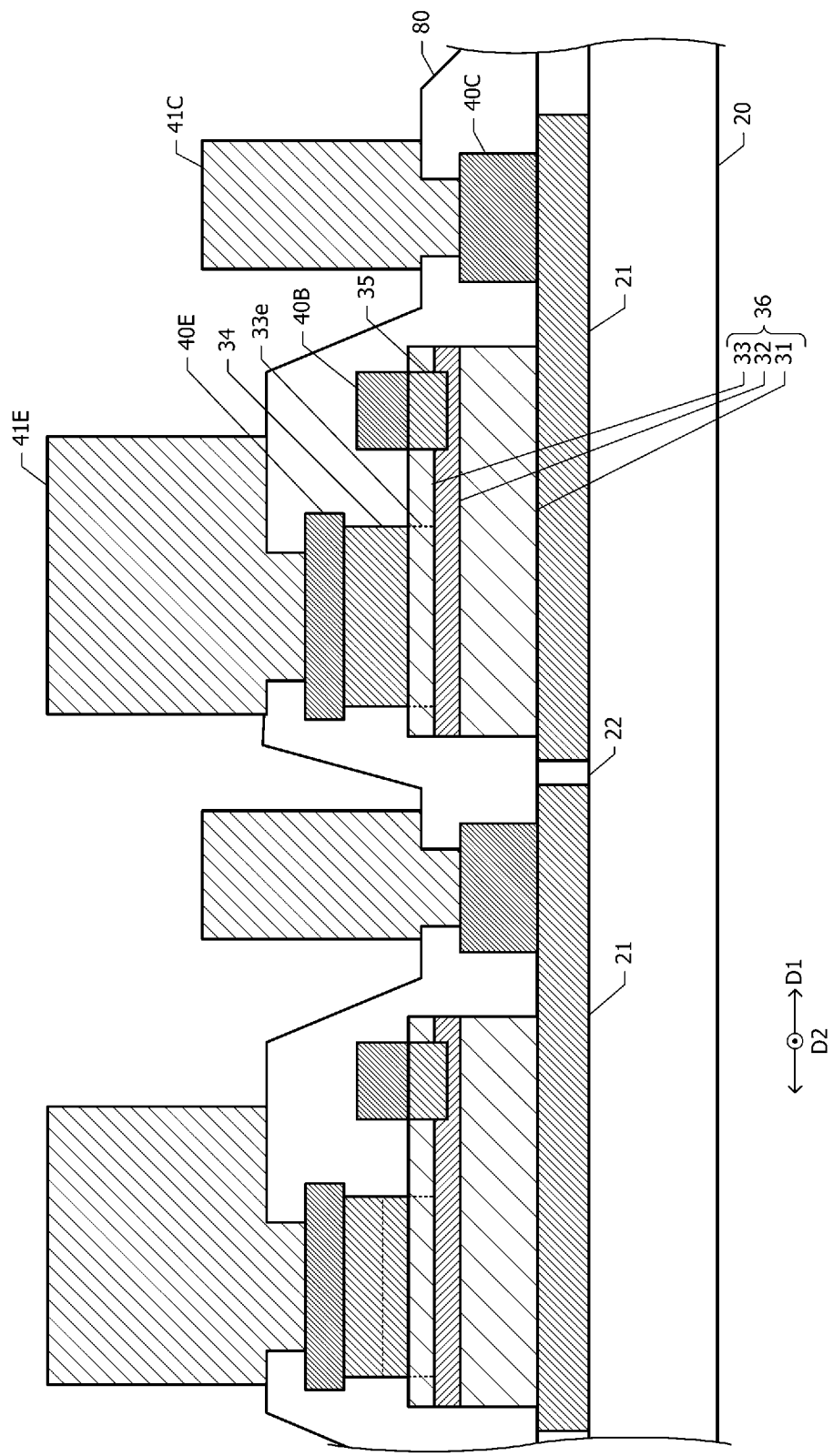
FIG. 2 is a sectional view along alternate long and short dash line 2-2 in FIG. 1.
Figure 3:
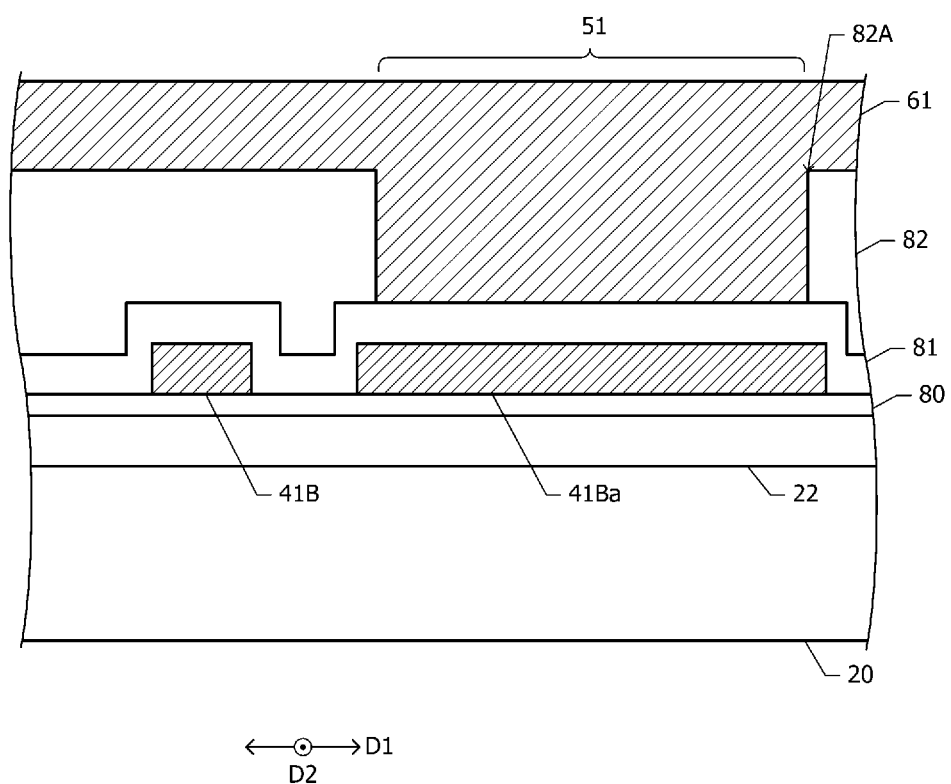
FIG. 3 is a sectional view along alternate long and short dash line 3-3 in FIG. 1.

FIG. 1 is a diagram illustrating the positional relationship, in plan view, of two of the bipolar transistors included in the power amplifying device according to the first embodiment, and capacitance devices and resistive devices connected to the two bipolar transistors. FIG. 2 is a sectional view along alternate long and short dash line 2-2 in FIG. 1. FIG. 3 is a sectional view along alternate long and short dash line 3-3 in FIG. 1.

FIG. 1 illustrates collector electrodes 40C, emitter electrodes 40E, and base electrodes 40B, which are depicted with relatively thick hatches going diagonally up to the right. FIG. 1 illustrates collector wiring lines 41C, emitter wiring lines 41E, base wiring lines 41B, a base-bias input wiring line 42, which are in the first layer and are depicted with relatively thin hatches going diagonally down to the right. FIG. 1 illustrates resistive devices 55 with relatively thin hatches going diagonally up to the right.

Multiple subcollector layers 21 (see FIGS. 1 and 2) having n-type conductivity are disposed in partial regions of the surface of a substrate 20 (see FIGS. 2 and 3). The subcollector layers 21 have, for example, a substantially rectangular shape in plan view. The subcollector layers 21 are formed, for example, of a semiconductor layer epitaxially grown on the substrate 20. Device isolation regions 22 (see FIGS. 2 and 3) are formed by making the region of the epitaxial growth layer other than the subcollector layers 21 insulating.

In plan view, bipolar transistors 30 are disposed in the respective subcollector layers 21. The bipolar transistors 30 are, for example, heterojunction bipolar transistors (HBTs). Each bipolar transistor 30 (see FIG. 2) includes a collector layer 31, a base layer 32, an emitter layer 33, and an emitter mesa layer 34 which are laminated in this sequence on the corresponding subcollector layer 21. In plan view, the contour lines of the base layer 32 and the emitter layer 33 match the contour line of the collector layer 31. The three-layer structure of the collector layer 31, the base layer 32, and the emitter layer 33 is called a base mesa layer 36. The base mesa layer 36 has a long shape in one direction (the left-right direction in FIG. 1) in plan view.

In plan view, the emitter mesa layer 34 is disposed in the emitter layer 33. The emitter mesa layer 34 has a long shape in the same direction as the longitudinal direction of the base mesa layer 36. The region of the emitter layer 33 that underlies the emitter mesa layer 34 actually serves as an emitter region 33e (see FIG. 2) of the bipolar transistor 30. That is, an emitter current flows in the emitter region 33e in the thickness direction. The emitter region 33e may be called an intrinsic emitter layer. The region of the emitter layer 33 which is other than the emitter region 33e is substantially depleted, and may be called a ledge layer.

The bipolar transistors 30 are disposed so as to be arranged side by side in the direction orthogonal to the longitudinal direction of the emitter mesa layers 34. Herein, the direction in which the bipolar transistors 30 are arranged is referred to as the first direction D1. The longitudinal direction of the emitter mesa layers 34 is referred to as the second direction D2.

On each subcollector layer 21, the collector electrode 40C and the collector layer 31 are disposed with a space interposed in between in the first direction D1. The collector electrode 40C is electrically connected to the collector layer 31 through the subcollector layer 21.

The emitter electrode 40E is disposed on the emitter mesa layer 34 so as to include the emitter mesa layer 34 in plan view. The emitter electrode 40E extends out slightly relative to the edges of the emitter mesa layer 34. A self-aligned process using the emitter electrode 40E as an etching mask is applied to patterning of the emitter mesa layer 34. The emitter electrode 40E is electrically connected to the emitter layer 33 through the emitter mesa layer 34.

The base electrode 40B is disposed on the emitter layer 33. The base electrode 40B is electrically connected to the base layer 32 through an alloyed region 35 reaching the base layer 32 through the emitter layer 33. The base electrode 40B includes one main base-electrode portion 40BF and one base-electrode pad portion 40BP. The main base-electrode portion 40BF has a long shape in the second direction D2 in plan view. The main base-electrode portion 40BF is disposed so as to be separated from the emitter mesa layer 34 with a space interposed in between in the first direction D1. The collector electrode 40C, the main base-electrode portion 40BF, and the emitter electrode 40E are disposed in this sequence in the first direction D1. The base-electrode pad portion 40BP connects with the main base-electrode portion 40BF in one of the end portions of the main base-electrode portion 40BF.

An insulating film 80 (see FIG. 2) is formed over the substrate so as to cover the bipolar transistors 30, the emitter electrodes 40E, the base electrodes 40B, and the collector electrodes 40C. The emitter wiring lines 41E, the collector wiring lines 41C, the base wiring lines 41B, and the base-bias input wiring lines 42 in the first layer are disposed on the insulating film 80.

Each emitter wiring line 41E in the first layer is disposed so as to overlap the emitter electrode 40E partially in plan view. The emitter wiring line 41E is connected to the emitter electrode 40E through a contact hole formed through the insulating film 80 (see FIG. 2).

Each collector wiring line 41C in the first layer is disposed so as to overlap the collector electrode 40C partially in plan view. The collector wiring line 41C is connected to the collector electrode 40C through a contact hole formed through the insulating film 80 (see FIG. 2). In plan view, the collector wiring line 41C extends from the overlapping region on the collector electrode 40C to the outside of the subcollector layer 21 toward one side of the second direction D2 (toward the right in FIG. 1).

Each base wiring line 41B in the first layer is disposed so as to overlap the base-electrode pad portion 40BP of the base electrode 40B partially in plan view. The base wiring line 41B is connected to the base electrode 40B through a contact hole formed through the insulating film 80 (see FIG. 2). In plan view, the base wiring line 41B extends from the overlapping region on the base-electrode pad portion 40BP to the outside of the subcollector layer 21 toward one side of the second direction D2 (toward the left in FIG. 1). The collector wiring line 41C and the base wiring line 41B extend toward the respective opposite directions when viewed from the bipolar transistors 30.

A radio-frequency signal input wiring line 61, which extends in the first direction D1, intersects the base wiring lines 41B. The radio-frequency signal input wiring line 61 is disposed in the second wiring layer above the base wiring lines 41B in the first layer. Two insulating films 81 and 82 (see FIG. 3) are disposed between the radio-frequency signal input wiring line 61 and the base wiring lines 41B. The insulating films 81 and 82 are formed of corresponding insulation materials different from each other.

A part of each base wiring line 41B has a dimension in the first direction D1 which is larger than that of the other part. The part, whose dimension in the first direction D1 is relatively large, is referred to as a widened portion 41Ba. In plan view, a cavity 82A formed through the insulating film 82 is disposed in the overlapping region between the radio-frequency signal input wiring line 61 and the widened portion 41Ba. In plan view, the cavity 82A is included in the widened portion 41Ba. Inside the cavity 82A, only the insulating film 81 is interposed between the radio-frequency signal input wiring line 61 and the base wiring line 41B. In plan view, a first capacitance device 51, in which the base wiring line 41B and the radio-frequency signal input wiring line 61 serve as a lower electrode and an upper electrode, respectively, is formed in the cavity 82A.

The first capacitance device 51 is connected to the base electrode 40B through the base wiring line 41B. The radio-frequency signal input wiring line 61 is supplied with a radio frequency signal from an upstream amplifying circuit or an input terminal. The radio frequency signal supplied to the radio-frequency signal input wiring line 61 is input to the base electrode 40B through the first capacitance device 51 and the base wiring line 41B. One of the first capacitance devices 51 illustrated in FIG. 1 is disposed at a position different from that of the other first capacitance device 51 when viewed in the first direction D1. One of the first capacitance devices 51 is disposed so as to overlap the other first capacitance device 51 partially when viewed in the second direction D2 from the bipolar transistors. The expression, "Two objects are disposed at different positions when viewed in X direction," means that "Two objects are subjected to orthographic projection onto a virtual straight line orthogonal to X direction, and the two resulting line images do not overlap each other." The expression, "Two objects are disposed so as to overlap each other when viewed in X direction," means that "Two objects are subjected to orthographic projection onto a virtual straight line orthogonal to X direction, and the two resulting line images overlap each other."

The extremities of the base wiring lines 41B reach positions farther than the radio-frequency signal input wiring line 61 when viewed from the bipolar transistors 30. The base wiring lines 41B are connected to the base-bias input wiring line 42 through the respective resistive devices 55. A base bias current is supplied to the base electrodes 40B from the base-bias input wiring line 42 through the base wiring lines 41B.

Exemplary materials of the components of the bipolar transistors 30 will be described. For example, a semi-insulating GaAs substrate is used as the substrate 20. The subcollector layers 21 are formed, for example, of an n-type GaAs layer which has a thickness equal to or greater than about 400 nm and equal to or less than about 1000 nm (i.e., from about 400 nm to about 1000 nm) and which is epitaxially growth on the substrate 20. In the n-type GaAs layer, silicon (Si) is doped as an n-type dopant, and its concentration is equal to or greater than about $2\times10^{18}$ cm$^{-3}$ and equal to or less than about $4\times10^{18}$ cm$^{-3}$ (i.e., from about $2\times10^{18}$ cm$^{-3}$ to about $4\times10^{18}$ cm$^{-3}$). Instead of Si, tellurium (Te) may be used as an n-type dopant. The device isolation regions 22 are made insulating by implanting, for example, boron (B), oxygen (O), or helium (He).

The collector layers 31 are formed, for example, of Si-doped n-type GaAs, and their thickness is equal to or greater than about 500 nm and equal to or less than about 2000 nm (i.e., from about 500 nm to about 2000 nm). The Si doping concentration changes in the thickness direction.

The base layers 32 are formed, for example, of carbon (C)-doped p-type GaAs, InGaAs, or GaAsSb, and their thickness is equal to or greater than about 50 nm and equal to or less than about 150 nm (i.e., from about 50 nm to about 150 nm). The C doping concentration is equal to or greater than about $1\times10^{19}$ cm$^{-3}$ and equal to or less than about $5\times10^{19}$ cm$^{-3}$ (i.e., from about $1\times10^{19}$ cm$^{-3}$ to about $5\times10^{19}$ cm$^{-3}$). The sheet resistance of the base layers 32 is equal to or greater than about 130 Ω/sq and equal to or less than about 300 Ω/sq (i.e., from about 130 Ω/sq to about 300 Ω/sq).

The emitter layers 33 are formed, for example, of Si-doped n-type InGaP, and their thickness is equal to or greater than about 20 nm and equal to or less than about 50 nm (i.e., from about 20 nm to about 50 nm). The Si doping concentration is equal to or greater than about $2\times10^{17}$ cm$^{-3}$ and equal to or less than about $5\times10^{17}$ cm$^{-3}$ (i.e., from about $2\times10^{17}$ cm$^{-3}$ to about $5\times10^{17}$ cm$^{-3}$).

Each emitter mesa layer 34 includes two layers of a cap layer and a contact layer disposed on the cap layer. The cap layer is formed of Si-doped n-type GaAs, and its thickness is equal to or greater than about 50 nm and equal to or less than about 200 nm (i.e., from about 50 nm to about 200 nm). The Si doping concentration is equal to or greater than about $2\times10^{18}$ cm$^{-3}$ and equal to or less than about $4\times10^{18}$ cm$^{-3}$ (i.e., from about $2\times10^{18}$ cm$^{-3}$ to about $4\times10^{18}$ cm$^{-3}$). The contact layer is formed of Si-doped n-type InGaAs, and its thickness is equal to or greater than about 100 nm and equal to or less than about 200 nm (i.e., from about 100 nm to about 200 nm). The Si doping concentration is equal to or greater than about $1\times10^{19}$ cm$^3$ and equal to or less than about $3\times10^{19}$ cm$^{-3}$ (i.e., from about $1\times10^{19}$ cm$^{-3}$ to about $3\times10^{19}$ cm$^{-3}$).

Figure 4:
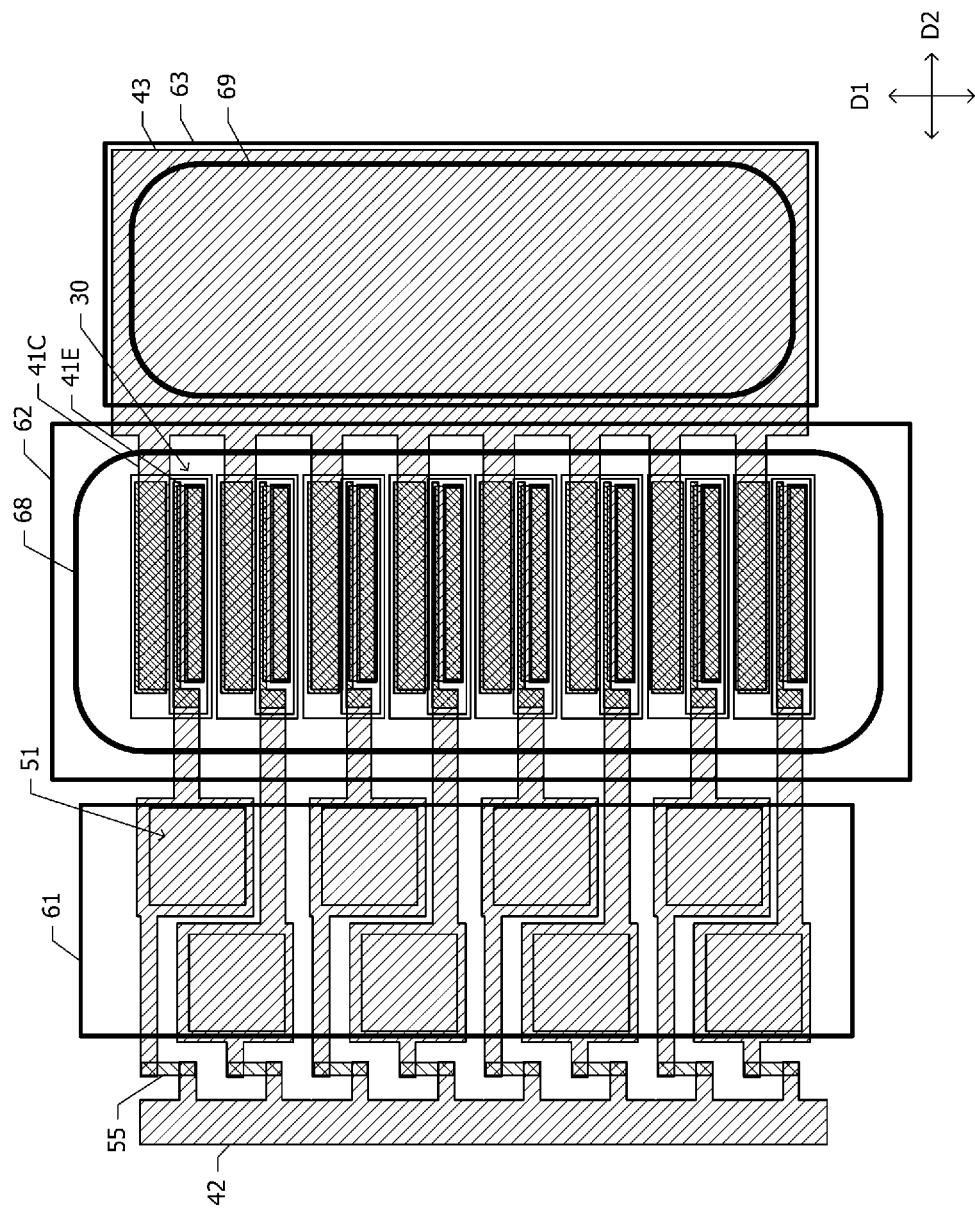
FIG. 4 is a diagram illustrating the positional relationship, in plan view, of the components of a power amplifying device according to the first embodiment.

FIG. 4 is a diagram illustrating the positional relationship, in plan view, of the components of the power amplifying device according to the first embodiment. The bipolar transistors 30 are disposed side by side in the first direction D1. A collector common wiring line 43 is disposed on one side (on the right in FIG. 4) of the bipolar transistors 30 in the second direction D2. The first capacitance devices 51 are disposed on the other side. The radio-frequency signal input wiring line 61 is disposed so as to overlap the first capacitance devices 51. The collector wiring lines 41C, which are drawn from the respective bipolar transistors 30 toward one side of the second direction D2, connect with the collector common wiring line 43.

The resistive devices 55 are disposed farther than the first capacitance devices 51 when viewed from the bipolar transistors 30. The base-bias input wiring line 42, which is shared by the bipolar transistors 30, is disposed farther than the resistive devices 55 when viewed from the bipolar transistors 30. The radio-frequency signal input wiring line 61 and the base-bias input wiring line 42 extend in the first direction D1.

An output wiring line 63 is disposed so as to overlap the collector common wiring line 43 in plan view. A ground wiring line 62 is disposed so as to include the emitter wiring lines 41E in the first layer in plan view. The output wiring line 63 and the ground wiring line 62 are disposed in the second layer like the radio-frequency signal input wiring line 61. The two layers, the insulating films 81 and 82 (see FIG. 3), are disposed under the output wiring line 63 and the ground wiring line 62.

The ground wiring line 62 is connected to the emitter wiring lines 41E through multiple cavities formed through the insulating films 81 and 82. That is, the emitter wiring lines 41E connect with the common ground wiring line 62. The output wiring line 63 is connected to the collector common wiring line 43 through a cavity formed through the insulating films 81 and 82.

A ground bump 68 is disposed so as to be included in the ground wiring line 62 in plan view. An output bump 69 is disposed so as to be included in the output wiring line 63. For example, Cu pillar bumps are used as the ground bump 68 and the output bump 69. The ground bump 68 and the output bump 69 are connected to corresponding terminals of a module substrate or the like. Thus, the emitters of the bipolar transistors 30 are grounded. A radio frequency signal amplified by the bipolar transistors 30 is output to a module substrate or the like through the output bump 69.

When one of the bipolar transistors 30 is focused, the first capacitance device 51 connected to the focused bipolar transistor 30 and the first capacitance device 51 connected to an adjacent bipolar transistor 30 are disposed at different positions when viewed in the first direction D1. The two first capacitance devices 51 are disposed so as to overlap each other partially when viewed from the bipolar transistors in the second direction D2.

Figure 5:
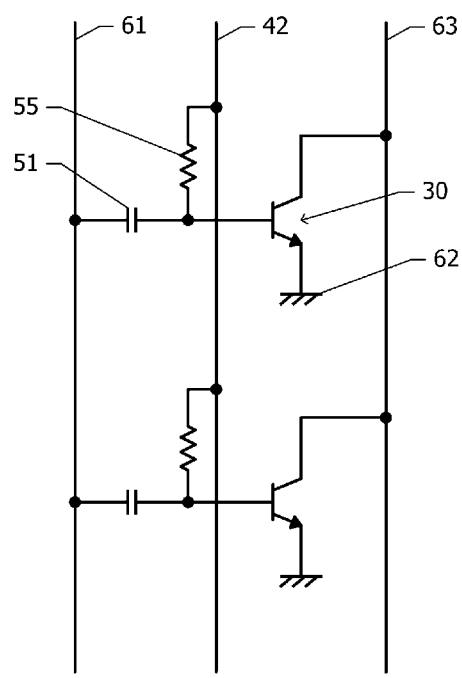
FIG. 5 is an equivalent circuit diagram illustrating a part of a power amplifying device according to the first embodiment.

FIG. 5 is an equivalent circuit diagram illustrating a part of the power amplifying device according to the first embodiment. The emitters of the bipolar transistors 30 are connected (grounded) to the ground wiring line 62. The collectors are connected to the output wiring line 63. The bases of the bipolar transistors 30 are connected to the radio-frequency signal input wiring line 61 through the first capacitance devices 51, and connected to the base-bias input wiring line 42 through the resistive devices 55.

Excellent effect of the first embodiment will be described.

An operation performed in occurrence of the following state (a disruption of the current uniformity) will be described. The state is such that a base current (both of a base bias current and a radio frequency current) in one bipolar transistor 30 (see FIG. 4) is slightly larger than a base current in another bipolar transistor 30. A disruption of the current uniformity may occur, for example, when the spaces between the emitter mesa layers 34 (see FIG. 1) and the main base-electrode portions 40BF (see FIG. 1) of the base electrodes 40B vary between bipolar transistors 30.

When occurrence of a disruption of the uniformity in base current causes a base current of a specific bipolar transistor 30 to be made relatively larger, a voltage decrease caused by the resistive device 55 (see FIG. 1) connected to the base electrode 40B of the bipolar transistor 30 is made relatively large. As a result, the potential of the base electrode 40B decreases relatively. The decrease of the potential of the base electrode 40B decreases the base current. This suppresses magnification of the disruption of the uniformity in base current. As a result, a disruption of the uniformity in emitter current hardly occurs.

In addition, if main base-electrode portions 40BF of a base electrode 40B are disposed on both the sides of one emitter mesa layer 34, the uniformity of the base currents supplied from the two main base-electrode portions 40BF may be disrupted in the single bipolar transistor 30. For example, such a state may occur when misalignment within an allowable range produced in a manufacture process causes the spaces between the two main base-electrode portions 40BF and the emitter mesa layer 34 not to be the same. When the uniformity of the base currents is disrupted in one bipolar transistor 30, the uniformity of the emitter current is also disrupted, and the thermal effect causes the base current to be concentrated more and more to one of the main base-electrode portions 40BF. As a result, the operation is made unstable.

In contrast, in the first embodiment, only one main base-electrode portion 40BF is disposed for one emitter mesa layer 34 (see FIG. 1). Therefore, a disruption of the uniformity in base current between main base-electrode portions does not occur.

Thus, the first embodiment achieves excellent effects: operation of a power amplifying device including bipolar transistors 30 is made stable; and a safe operating area (SOA) is enlarged. Enlargement of an SOA enables high-voltage operation of the bipolar transistors 30.

Figure 6A:
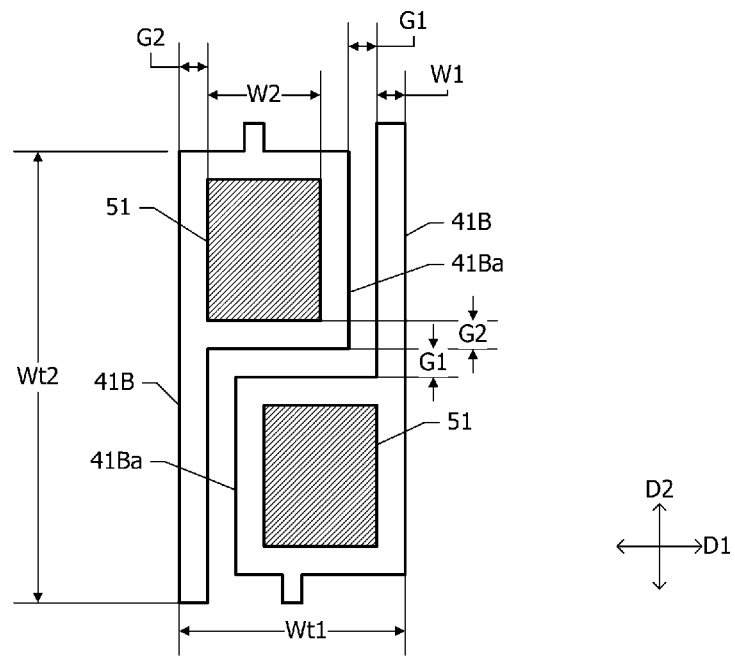
FIG. 6A is a plan view of two first capacitance devices of a power amplifying device according to the first embodiment.
Figure 6B:
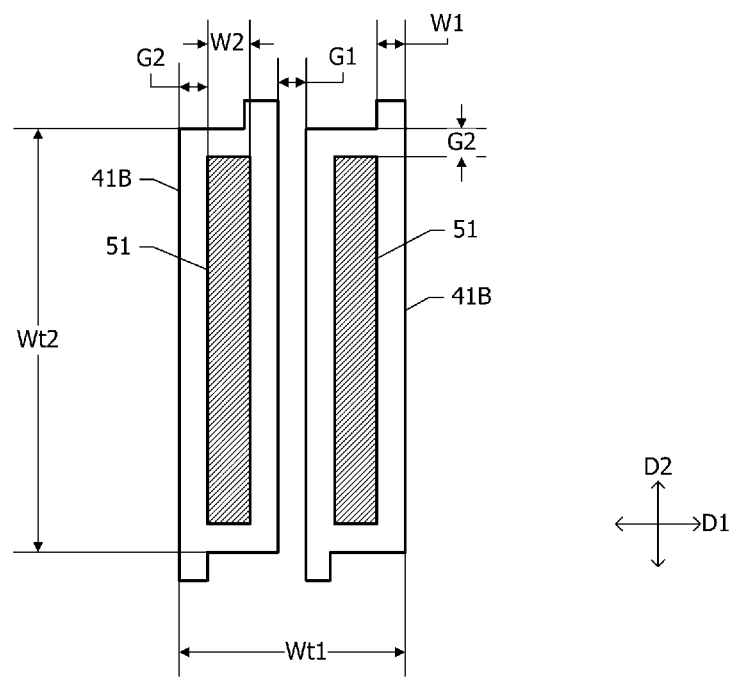
FIG. 6B is a plan view of two first capacitance devices of a power amplifying device according to a comparison example.

Referring to FIGS. 6A and 6B, excellent effect of the first embodiment will be described.

FIG. 6A is a plan view of two first capacitance devices 51 of the power amplifying device according to the first embodiment. FIG. 6B is a plan view of two first capacitance devices 51 of a power amplifying device according to a comparison example. In FIGS. 6A and 6B, the first capacitance devices 51 are hatched. In the first embodiment, the width of each base wiring line 41B is increased partially, and the first capacitance device 51 is disposed in the widened portion 41Ba. The two first capacitance devices 51 are disposed at different positions when viewed in the first direction D1. In contrast, in the comparison example illustrated in FIG. 6B, the two first capacitance devices 51 are disposed at the same position when viewed in the first direction D1, and are arranged side by side in the first direction D1. The edges of each first capacitance device 51 match the edges of the corresponding cavity 82A (see FIG. 3) formed through the insulating film 82.

The lower threshold of the space G1 between base wiring lines 41B, the lower threshold of the width W1 of a base wiring line 41B, the lower threshold of the dimension W2, in the first direction D1, of a cavity 82A (that is, a first capacitance device 51), and the lower threshold of the alignment margin G2 between an edge of a cavity 82A (that is, a first capacitance device 51) and an edge of a base wiring line 41B are determined in a process rule. For example, the following case will be discussed: the lower threshold of the space G1 is about 2 μm; the lower threshold of the width W1 is about 2 μm; the lower threshold of the dimension W2 is about 2 μm; the lower threshold of the alignment margin G2 is about 3 μm.

In the case of the first embodiment (see FIG. 6A), the lower threshold of the dimension Wt1, in the first direction D1, of the region occupied by the two first capacitance devices 51 is about 12 μm. In contrast, in the comparison example (see FIG. 6B), the lower threshold of the dimension Wt1, in the first direction D1, of the region occupied by the two first capacitance devices 51 is about 18 μm. Therefore, in the comparison example, it is not possible to set the pitch, in the first direction D1, of bipolar transistors 30 to a value equal to or less than about 18 μm. In the first embodiment, it is possible to narrow the pitch, in the first direction D1, of bipolar transistors 30 down to about 12 μm. This enables the dimension, in the first direction D1, of the power amplifying device to be made small.

In the first embodiment, the dimension W2, in the first direction D1, of each first capacitance device 51 is set to the lower threshold, about 2 μm, and the dimension in the second direction D2 is adjusted. Thus, the capacitance of each first capacitance device 51 may be set to a desired value.

In the first embodiment (see FIG. 6A), if the dimension Wt1 is set to about 18 μm, which is the lower threshold of the dimension Wt1 in the comparison example (see FIG. 6B), the dimension W2, in the first direction D1, of each first capacitance device 51 may be increased up to about 8 μm. For example, the case in which the area of each first capacitance device 51 is about 8×8=64 μm² will be discussed. In the first embodiment, the dimension, in the second direction D2, of each first capacitance device 51 is about 8 μm. Therefore, the dimension Wt2, in the second direction D2, of the region occupied by the two first capacitance devices 51 is about 30 μm.

In contrast, in the comparison example, the dimension W2, in the first direction D1, of each first capacitance device 51 is about 2 μm. Thus, the dimension in the second direction D2 needs to be about 64/2=32 μm. Thus, in the comparison example, to ensure a desired capacitance under the condition that the dimension Wt1 is minimized, the first capacitance devices 51 need to be elongated. At that time, the dimension Wt2, in the second direction D2, of the region occupied by the two first capacitance devices 51 is about 38 μm.

Thus, the configuration of the first embodiment achieves the following effect. The shape of each first capacitance device 51, which is made closer to substantially a square, enables the area of the region, which is occupied by two first capacitance devices 51, to be smaller than that in the comparison example. This enables the area of the region, which is occupied by the power amplifying device, to be made small.

Figure 7:
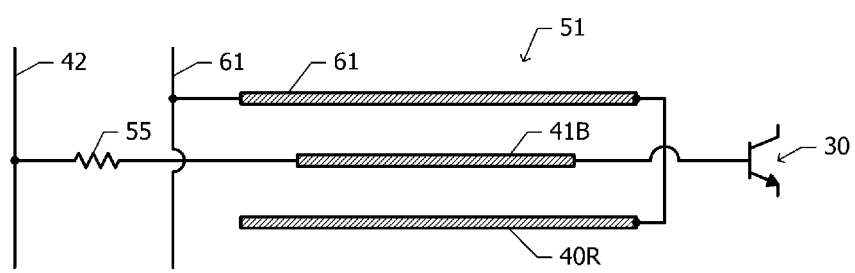
FIG. 7 is a sectional view of a first capacitance device of a power amplifying device according to a modified example of the first embodiment.

Referring to FIG. 7, a modified example of the first embodiment will be described.

FIG. 7 is a sectional view of a first capacitance device 51 of a power amplifying device according to the modified example of the first embodiment. In the first embodiment, a base wiring line 41B (see FIG. 3) disposed in the first wiring layer is used as a lower electrode of the first capacitance device 51. The radio-frequency signal input wiring line 61 disposed in the second wiring layer is used as an upper electrode of the first capacitance device 51. In the modified example, each first capacitance device 51 has three upper, middle, and lower layer electrodes.

The radio-frequency signal input wiring line 61 is used as the upper electrode, and the base wiring line 41B is used as the middle electrode. A lower electrode 40R is disposed in the same layer as the collector electrode 40C (see FIG. 2). The lower electrode 40R is disposed between a device isolation region 22 (see FIG. 3) and the insulating film 80 (see FIG. 3). The lower electrode 40R is connected to the radio-frequency signal input wiring line 61 through a contact hole formed through the insulating films 80, 81, and 82.

In the modified example, the capacitance per unit area of each first capacitance device 51 is larger than that in the first embodiment. Therefore, the area of the region occupied by each first capacitance device 51 may be made small.

Another modified example of the first embodiment will be described.

The bipolar transistors 30 arranged side by side in the first direction D1 are numbered starting from one for differentiation. In the first embodiment, the first capacitance devices 51 corresponding to the odd-numbered bipolar transistors 30 are disposed close to the bipolar transistors 30. The first capacitance devices 51 corresponding to the even-numbered bipolar transistors 30 are disposed far from the bipolar transistors 30. That is, when one bipolar transistor 30 is focused, the first capacitance device 51 connected to the focused bipolar transistor 30 is disposed so as to be shifted in the second direction D2 relative to the two first capacitance devices 51 connected to the two bipolar transistors 30 that are adjacent on both the sides of the focused bipolar transistor 30.

In the modified example, the first capacitance device 51 connected to the focused bipolar transistor 30 is disposed so as to be shifted in the second direction D2 relative to the first capacitance device 51 connected to a bipolar transistor 30 which is adjacent on one side of the focused bipolar transistor 30. In contrast, the first capacitance device 51 connected to the focused bipolar transistor 30 is disposed at the same position as that of the first capacitance device 51 connected to the other adjacent bipolar transistor 30, which is adjacent on the other side, when viewed in the first direction D1. For example, the following two arrangements are mirror symmetric with respect to the symmetry axis parallel to the second direction D2: a first arrangement of two first capacitance devices 51 disposed so as to overlap each other partially when viewed from the bipolar transistors in the second direction D2; a second arrangement of two first capacitance devices 51 adjacent to the first arrangement.

More generally, at least one of the first capacitance devices 51 is desirably disposed so as to overlap a different first capacitance device 51 partially when viewed from the bipolar transistors in the second direction D2. This arrangement may reduce the area of the region occupied by two first capacitance devices 51 disposed so as to overlap each other when viewed in the second direction D2.

Second Embodiment

Figure 8:
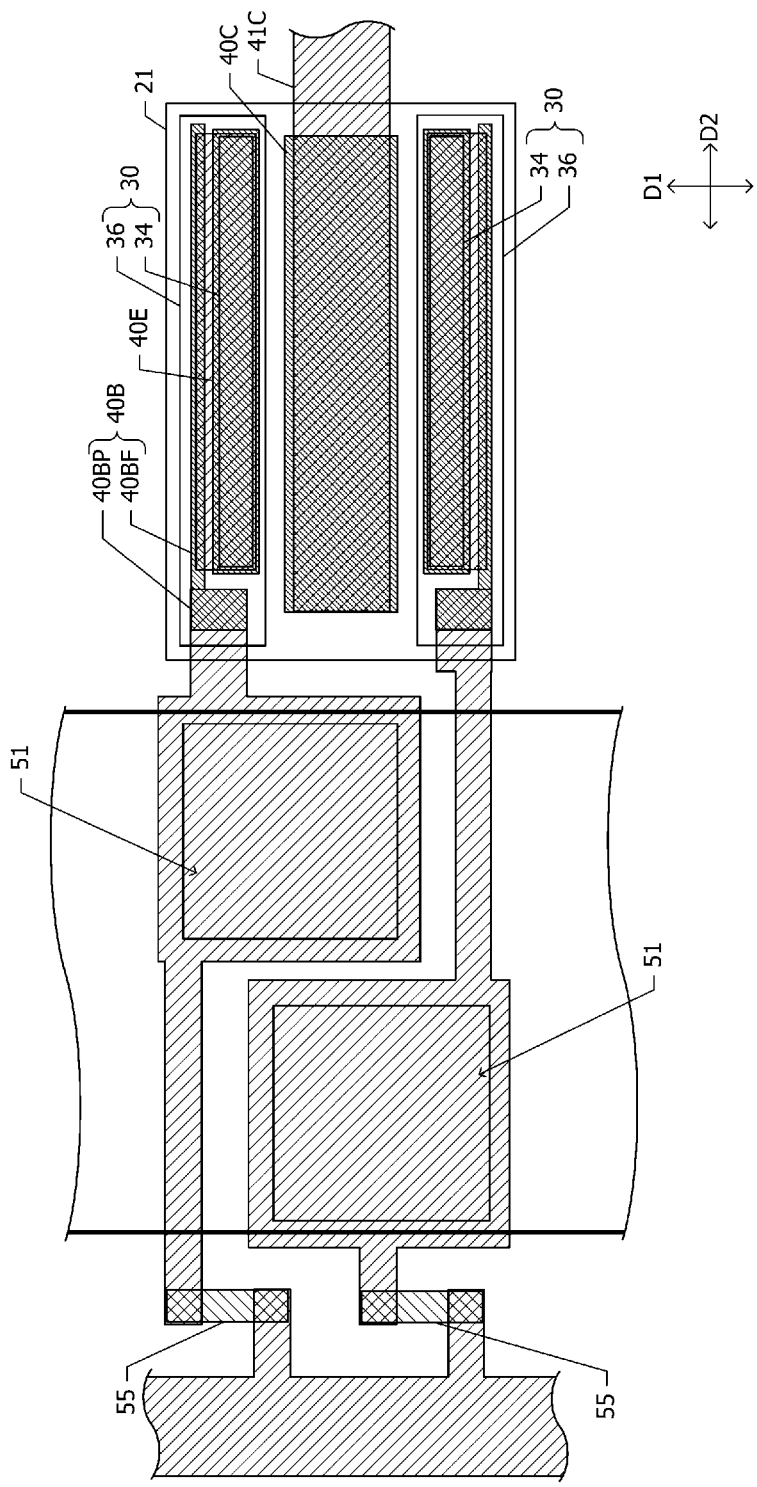
FIG. 8 is a diagram illustrating the positional relationship, in plan view, of two of the bipolar transistors included in a power amplifying device according to a second embodiment, and capacitance devices and resistive devices connected to the two bipolar transistors.

Referring to FIG. 8, a power amplifying device according to a second embodiment will be described. The configuration common to that of the power amplifying device according to the first embodiment will not be described.

FIG. 8 is a diagram illustrating the positional relationship, in plan view, of two of the bipolar transistors included in the power amplifying device according to the second embodiment, and capacitance devices and resistive devices connected to the two bipolar transistors. In the first embodiment, one bipolar transistor 30 (see FIGS. 1 and 2) is disposed in a subcollector layer 21 in plan view. In contrast, in the second embodiment, two bipolar transistors 30 are disposed in a single subcollector layer 21.

The configuration of each bipolar transistor 30 is the same as that according to the first embodiment (see FIGS. 1 and 2). That is, each bipolar transistor 30 includes the base mesa layer 36 and the emitter mesa layer 34. One collector electrode 40C is disposed between two base mesa layers 36. The collector wiring line 41C in the first layer is connected to the collector electrode 40C. When one bipolar transistor 30 is focused, the emitter mesa layer 34 is disposed closer to the collector electrode 40C than the main base-electrode portion 40BF. For example, the configuration of two bipolar transistors 30 disposed in one subcollector layer 21 has a mirror symmetric relationship.

In the first embodiment, a collector electrode 40C is disposed for each bipolar transistor 30. In the second embodiment, two bipolar transistors 30 share one collector electrode 40C. Like the first embodiment, also in the second embodiment, two base electrodes 40B are connected to corresponding first capacitance devices 51 and resistive devices 55.

Excellent effect of the second embodiment will be described.

In the second embodiment, two bipolar transistors 30 share one collector electrode 40C. Thus, the bipolar transistors 30 may be disposed in the first direction in a density higher than that in the first embodiment. Therefore, the dimension Wt1 (see FIG. 6A), in the first direction D1, of the region occupied by two first capacitance devices 51 is smaller than that in the first embodiment.

The configuration of the comparison example in FIG. 6B under the condition that the dimension Wt1 (see FIGS. 6A and 6B) is made small needs the first capacitance devices 51 having a longer length in the second direction D2 in order to ensure a necessary capacitance. Therefore, the area of the region for allocating the alignment margin G2 is made large, and the area of a useless region, which does not contribute to the capacitance, is made large. In the second embodiment, the shape of each first capacitance device 51 is close to a rectangle. Thus, an increase of the useless region, which is obtained when the dimension Wt1 is made small, is smaller than that in the comparison example. Thus, the second embodiment has a greater effect of arrangement of two first capacitance devices 51 shifted in the second direction D2.

Third Embodiment

Figure 9:
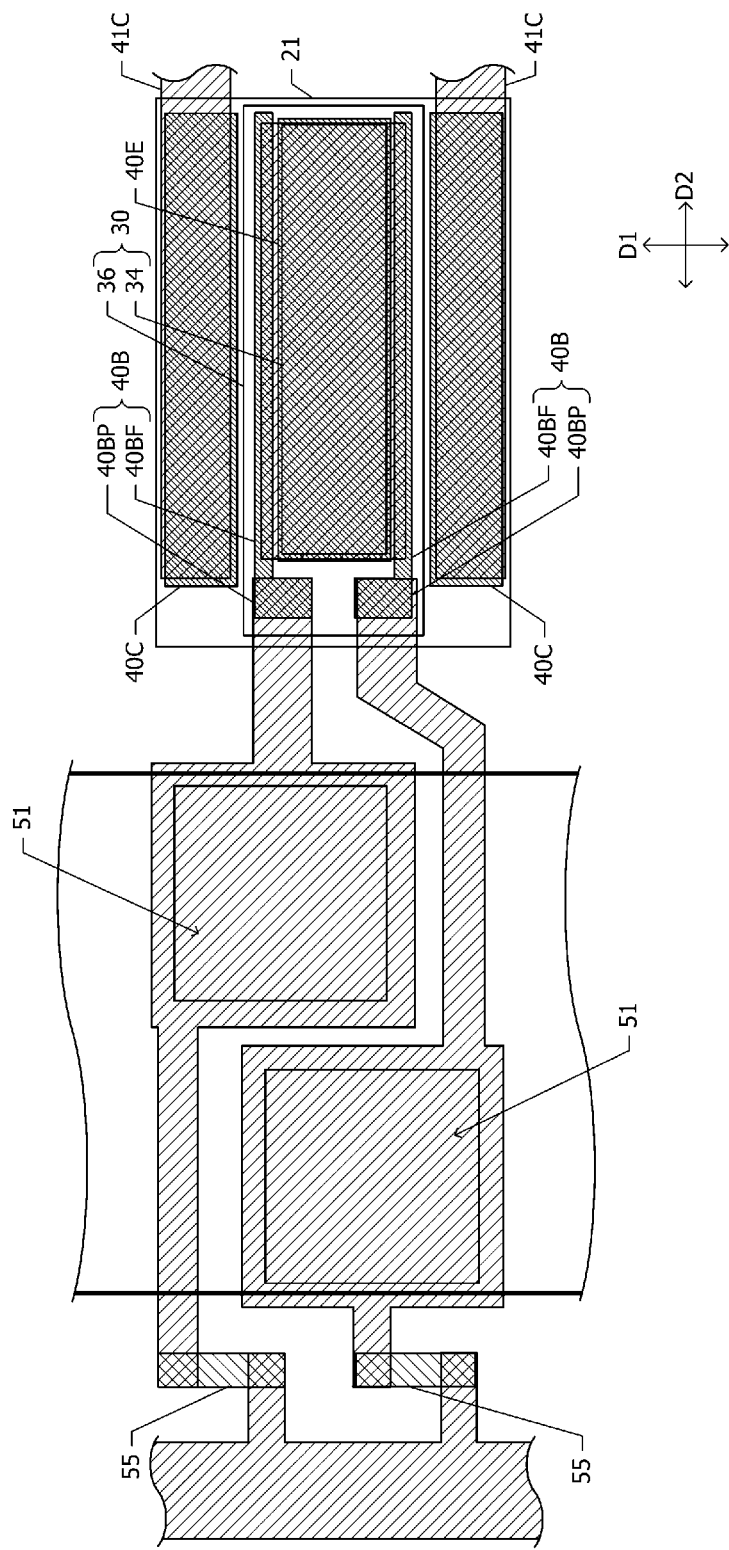
FIG. 9 is a diagram illustrating the positional relationship, in plan view, of one of the bipolar transistors included in a power amplifying device according to a third embodiment, and capacitance devices and resistive devices which are connected to the bipolar transistor.

Referring to FIG. 9, a power amplifying device according to a third embodiment will be described. The configuration common to the power amplifying device (see FIGS. 1 to 5) according to the first embodiment will not be described.

FIG. 9 is a diagram illustrating the positional relationship, in plan view, of one of the bipolar transistors included in the power amplifying device according to the third embodiment, and capacitance devices and resistive devices connected to the bipolar transistor. In the first embodiment, for one bipolar transistor 30 (see FIG. 1), a single base electrode 40B is disposed for a single emitter mesa layer 34. In contrast, in the third embodiment, two base electrodes 40B are disposed for one emitter mesa layer 34. That is, two base electrodes 40B, which are separated from each other, are disposed in one base mesa layer 36 in plan view.

The main base-electrode portions 40BF of the two base electrodes 40B are disposed with the emitter mesa layer 34 interposed in between in the first direction D1. Two collector electrodes 40C are disposed with the base mesa layer 36 interposed in between in the first direction D1. The two collector electrodes 40C are connected to corresponding collector wiring lines 41C. The area of the emitter mesa layer 34 in plan view is about twice the area of an emitter mesa layer 34 (see FIG. 1) of the power amplifying device according to the first embodiment. More specifically, the dimension (width), in the first direction D1, of the emitter mesa layer 34 is about twice that in the first embodiment.

The two base electrodes 40B are connected to corresponding base wiring lines 41B. One first capacitance device 51 and one resistive device 55 are disposed for each base electrode 40B.

Excellent effect of the third embodiment will be described.

If the two main base-electrode portions 40BF corresponding to a single bipolar transistor 30 according to the third embodiment are connected to each other and one first capacitance device 51 and one resistive device 55 are disposed, a disruption of the uniformity in base current between the two main base-electrode portions 40BF fails to be suppressed. In contrast, in the third embodiment, the two main base-electrode portions 40BF are connected to the respective separate first capacitance devices 51 and the respective separate resistive devices 55. Therefore, in one bipolar transistor 30, a disruption of the uniformity in base current between the two main base-electrode portions 40BF may be suppressed. Thus, a disruption of the uniformity in emitter current hardly occurs, achieving an excellent effect of enlargement of an SOA.

Like the first embodiment, also in the third embodiment, the area of the region occupied by the first capacitance devices 51 may be made small.

Fourth Embodiment

Figure 10:
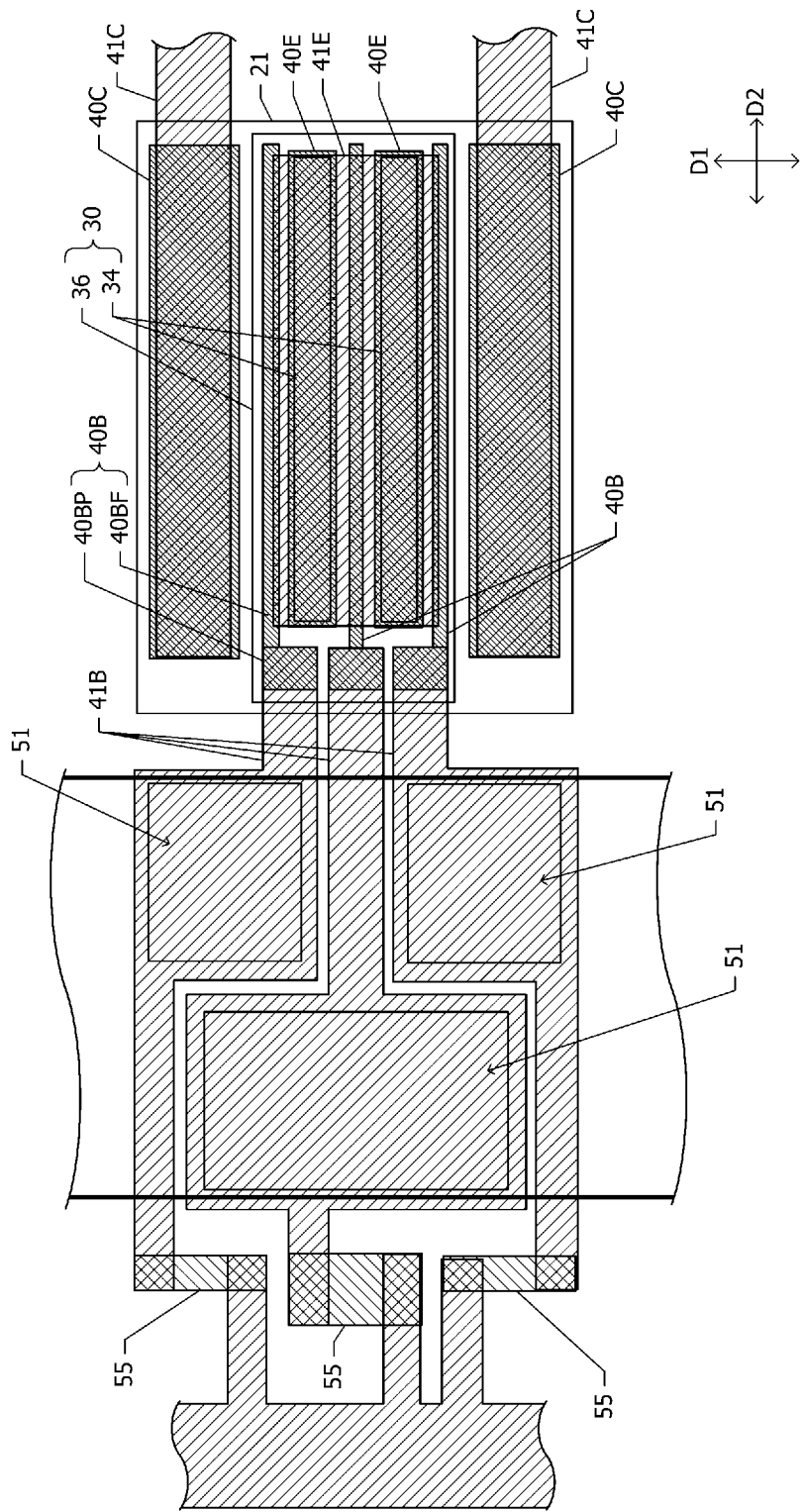
FIG. 10 is a diagram illustrating the positional relationship, in plan view, of one of the bipolar transistors included in a power amplifying device according to a fourth embodiment, and capacitance devices and resistive devices connected to the bipolar transistor.

Referring to FIG. 10, a power amplifying device according to a fourth embodiment will be described. The configuration common to the power amplifying device (see FIG. 9) according to the third embodiment will not be described.

FIG. 10 is a diagram illustrating the positional relationship, in plan view, of one of the bipolar transistors included in the power amplifying device according to the fourth embodiment, and capacitance devices and resistive devices connected to the bipolar transistor. In the third embodiment, one bipolar transistor 30 (see FIG. 9) includes one emitter mesa layer 34. In contrast, in the fourth embodiment, one bipolar transistor 30 includes two emitter mesa layers 34. That is, two emitter mesa layers 34 are disposed in one base mesa layer 36 in plan view.

The two emitter mesa layers 34 are disposed with a space interposed in the first direction D1. Emitter electrodes 40E are disposed corresponding to the respective two emitter mesa layers 34. One emitter wiring line 41E is disposed so as to overlap the two emitter electrodes 40E partially in plan view. One emitter wiring line 41E is connected to the two emitter electrodes 40E.

Three base electrodes 40B are disposed corresponding to one bipolar transistor 30. The main base-electrode portion 40BF of one base electrode 40B is disposed between the two emitter mesa layers 34. The main base-electrode portions 40BF of the other two base electrodes 40B are disposed on the outside of the two emitter mesa layers 34. Therefore, main base-electrode portions 40BF are disposed on both the sides of each of the two emitter mesa layers 34.

The two emitter mesa layers 34 and the three base electrodes 40B are disposed in the one base mesa layer 36 in plan view. Collector electrodes 40C are disposed on both the sides of the base mesa layer 36. The two collector electrodes 40C are connected to corresponding collector wiring lines 41C.

Separate base wiring lines 41B are connected to the respective three base electrodes 40B. Similarly, one first capacitance device 51 and one resistive device 55 are connected to each of the three base electrodes 40B. The two first capacitance devices 51 connected to the respective outer base electrodes 40B are disposed at different positions in the first direction D1 and at the same position in the second direction D2. The first capacitance device 51 connected to the center base electrode 40B is disposed so as to be shifted in the second direction D2 relative to the two first capacitance devices 51 connected to the respective two outer base electrodes 40B. When viewed from the bipolar transistors in the second direction, the first capacitance device 51 connected to the center base electrode 40B is disposed so as to overlap the other two first capacitance devices 51 partially. The area, in plan view, of the first capacitance device 51 connected to the center base electrode 40B is about twice the area, in plan view, of each of the other two first capacitance devices 51. The width, in plan view, of the resistive device 55 connected to the center base electrode 40B is about twice the width, in plan view, of each of the other two resistive devices 55.

Excellent effect of the fourth embodiment will be described.

Like the third embodiment, also in the fourth embodiment, one first capacitance device 51 and one resistive device 55 are connected corresponding to each base electrode 40B. Therefore, a disruption of the uniformity in base current may be suppressed between the main base-electrode portions 40BF. Like the third embodiment, also in the fourth embodiment, two first capacitance devices 51 connected to the respective two base electrodes 40B adjacent to each other in the first direction are disposed so as to be shifted in the second direction D2, and are disposed so as to overlap each other partially when viewed in the second direction D2 from the bipolar transistors. Therefore, the area of the region occupied by the first capacitance devices 51 may be made small.

In the fourth embodiment, the center base electrode 40B supplies an input signal to the emitter regions 33e (see FIG. 2) corresponding to the two emitter mesa layers 34. The outer base electrodes 40B supply an input signal to the emitter region 33e (see FIG. 2) corresponding to one emitter mesa layer 34. Therefore, a bias current and a radio frequency current, which are about twice those in the outer base electrodes 40B, flow through the center base electrode 40B.

The area, in plan view, of the first capacitance device 51 connected to the center base electrode 40B is about twice the area, in plan view, of each of the other two first capacitance devices 51. Thus, the capacitance of the first capacitance device 51 connected to the center base electrode 40B is also about twice the capacitance of each of the other two first capacitance devices 51. The width, in plan view, of the resistive device 55 connected to the center base electrode 40B is about twice the width, in plan view, of each of the other two resistive devices 55. Thus, the resistance value of the resistive device 55 connected to the center base electrode 40B is about half the resistance value of each of the other two resistive devices 55. Therefore, the impedance connected to the center base electrode 40B is about half the impedance connected to each of the other two base electrodes 40B. Since the impedance connected to the center base electrode 40B is about the half, the voltage produced at the center base electrode 40B is equal to the voltage produced at each of the outer base electrodes 40B. Thus, the three base electrodes 40B, which are separate from each other, operate as a single base electrode obtained through mutual connection.

A modified example of the fourth embodiment will be described.

In the fourth embodiment, one bipolar transistor 30 includes two emitter mesa layers 34. Alternatively, three or more emitter mesa layers 34 may be included. In this case, the number of base electrodes 40B may be the number of emitter mesa layers 34 plus one. Thus, the main base-electrode portions 40BF of base electrodes 40B may be disposed on both the sides of each of the emitter mesa layers 34.

Fifth Embodiment

Figure 11:
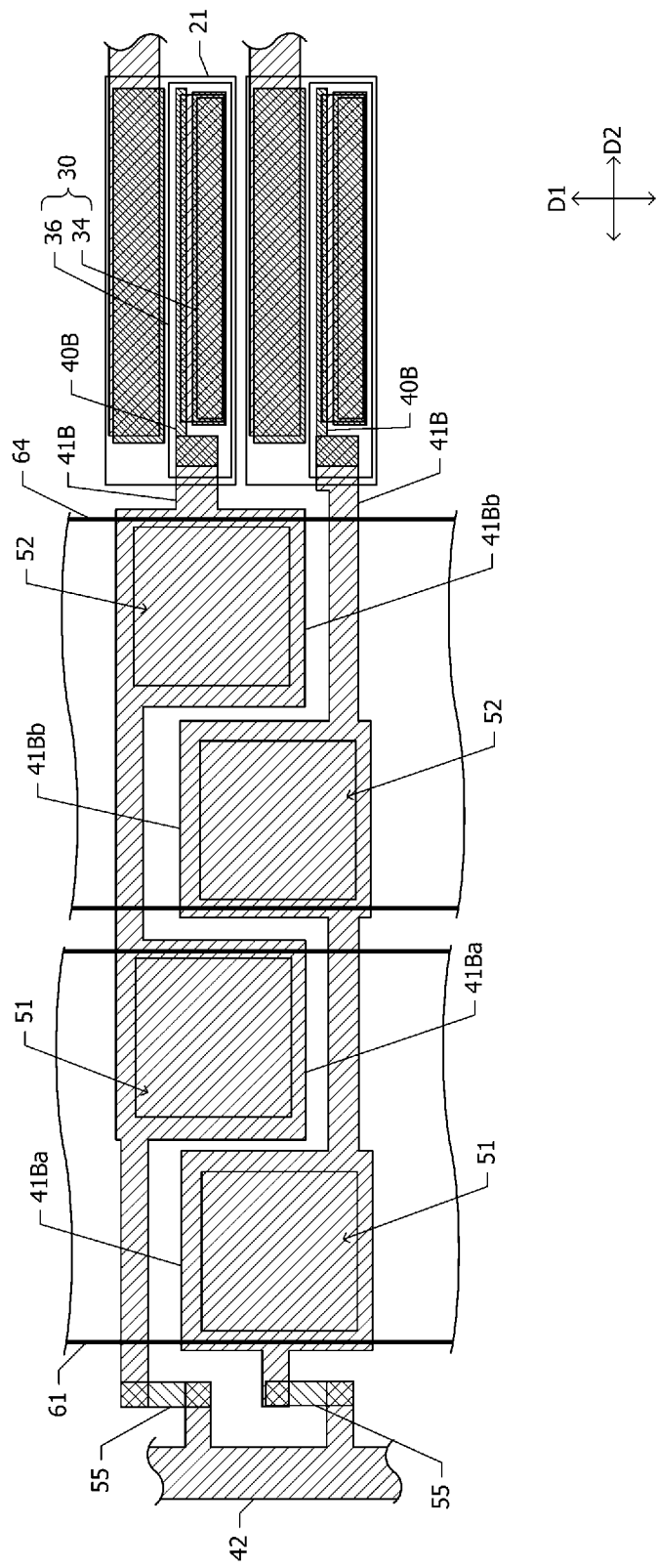
FIG. 11 is a diagram illustrating the positional relationship, in plan view, of two of the bipolar transistors included in a power amplifying device according to a fifth embodiment, and capacitance devices and resistive devices connected to the two bipolar transistors.
Figure 12:
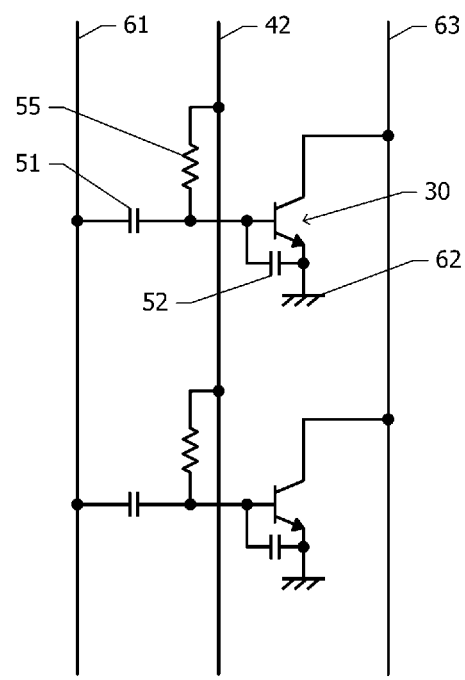
FIG. 12 is an equivalent circuit diagram illustrating a part of a power amplifying device according to the fifth embodiment.

Referring to FIGS. 11 and 12, a power amplifying device according to a fifth embodiment will be described. The configuration common to that of the power amplifying device (see FIGS. 1 to 5) according to the first embodiment will not be described.

FIG. 11 is a diagram illustrating the positional relationship, in plan view, of two of the bipolar transistors included in the power amplifying device according to the fifth embodiment, and capacitance devices and resistive devices connected to the two bipolar transistors. In the first embodiment, one first capacitance device 51 and one resistive device 55 are connected to each of the base electrodes 40B. In contrast, in the fifth embodiment, a second capacitance device 52 is further connected to each of the base electrodes 40B.

Each of the base wiring lines 41B includes a widened portion 41Bb, serving as a lower electrode of the second capacitance device 52, in addition to the widened portion 41Ba serving as the lower electrode of the first capacitance device 51. A ground wiring line 64 is disposed so as to overlap the widened portions 41Bb in plan view. The ground wiring line 64 extends in the first direction D1. The ground wiring line 64 is connected to the ground wiring line 62 (see FIG. 4) connected to the emitters of the bipolar transistors 30. The bipolar transistors 30, the ground wiring line 64, the radio-frequency signal input wiring line 61, and the base-bias input wiring line 42 are arranged in this sequence in the second direction D2.

Each second capacitance device 52 is formed at a position at which the widened portion 41Bb of the corresponding base wiring line 41B overlaps the ground wiring line 64. Two second capacitance devices 52 connected to the respective two base electrodes 40B adjacent to each other in the first direction D1 are disposed at different positions when viewed in the first direction D1 and are disposed so as to overlap each other partially in the first direction D1.

FIG. 12 is an equivalent circuit diagram illustrating a part of the power amplifying device according to the fifth embodiment. In the fifth embodiment, the second capacitance devices 52, each of which is connected between the base and emitter of the corresponding bipolar transistor 30, are added to the power amplifying device according to the first embodiment (see FIG. 5). The second capacitance devices 52 have a function for improving the efficiency of the bipolar transistor 30.

Excellent effect of the fifth embodiment will be described. In the fifth embodiment, like the first capacitance devices 51, the second capacitance devices 52 are disposed so as to be shifted in the second direction D2. Thus, the area of the region occupied by the second capacitance devices 52 may be made small.

The embodiments are exemplary. Needless to say, partial replacement or combination of the configurations described in different embodiments may be made. Substantially the same effect produced by substantially the same configurations of the embodiments is not described in each embodiment. Further, the present disclosure is not limited by the embodiments. For example, it is clear for those skilled in the art that various changes, improvements, combinations, and the like may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifying device comprising:
a plurality of bipolar transistors that are disposed side by side in a first direction on a substrate, each of the plurality of bipolar transistors including a collector layer, a base layer, an emitter layer, and at least one base electrode electrically connected to the base layer;
a plurality of first capacitance devices that are provided corresponding to the respective base electrodes of the plurality of bipolar transistors, each of the plurality of first capacitance devices having a first electrode and a second electrode, the first electrode being connected to the corresponding base electrode, the second electrode being supplied with a radio frequency signal, the plurality of first capacitance devices being disposed on an identical side relative to a second direction when viewed from the plurality of bipolar transistors, the second direction being orthogonal to the first direction, and at least one of the plurality of first capacitance devices being disposed so as to overlap a different first capacitance device partially when viewed in the second direction from the plurality of bipolar transistors; and
a plurality of resistive devices that are provided corresponding to the respective base electrodes of the plurality of bipolar transistors, each of the plurality of resistive devices having a first end and a second end, the first end being connected to the corresponding base electrode, the second end being supplied with a bias.

2. The power amplifying device according to claim 1, wherein
each of the plurality of bipolar transistors includes a single base electrode, and is provided with a corresponding one of the first capacitance devices, and
the first capacitance device connected to one of the plurality of bipolar transistors and the first capacitance device connected to an adjacent bipolar transistor are disposed at different positions when viewed in the first direction, and are disposed so as to overlap each other partially when viewed in the second direction from the plurality of bipolar transistors.

3. The power amplifying device according to claim 2, wherein
each of the plurality of bipolar transistors includes an emitter mesa layer that is disposed in a partial region of a top surface of the emitter layer and that is long in the second direction, and
the at least one base electrode includes a main base-electrode portion that is disposed with a space interposed in the first direction from the emitter mesa layer in plan view and that is long in the second direction.

4. The power amplifying device according to claim 2, wherein
each of the plurality of first capacitance devices includes three conductor layers,
the middle conductor layer is connected to the corresponding base electrode, and
the top conductor layer and the bottom conductor layer are connected to each other.

5. The power amplifying device according to claim 2, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

6. The power amplifying device according to claim 1, wherein
each of the plurality of bipolar transistors includes an emitter mesa layer that is disposed in a partial region of a top surface of the emitter layer and that is long in the second direction, and
the at least one base electrode includes a main base-electrode portion that is disposed with a space interposed in the first direction from the emitter mesa layer in plan view and that is long in the second direction.

7. The power amplifying device according to claim 6, wherein
the plurality of first capacitance devices are disposed corresponding to the respective main base-electrode portions of the base electrodes of the plurality of bipolar transistors.

8. The power amplifying device according to claim 7, wherein
each of the plurality of bipolar transistors includes the single emitter mesa layer and two main base-electrode portions disposed on both sides of the emitter mesa layer in plan view.

9. The power amplifying device according to claim 8, wherein
each of the plurality of first capacitance devices includes three conductor layers,
the middle conductor layer is connected to the corresponding base electrode, and
the top conductor layer and the bottom conductor layer are connected to each other.

10. The power amplifying device according to claim 8, further comprising:
a plurality of second capacitance devices that are connected to the respective base electrodes of the plurality of bipolar transistors, wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

11. The power amplifying device according to claim 7, wherein
each of the base electrode of the plurality of bipolar transistors includes three main base-electrode portions that are separate from each other and that are disposed side by side in the first direction,
each of the plurality of bipolar transistor includes the emitter mesa layers disposed between the center main base-electrode portion and the respective two outer main base-electrode portions, and
the first capacitance device connected to the center main base-electrode portion is disposed so as to be shifted in the second direction relative to the two first capacitance devices connected to the respective outer main base-electrode portions, and is disposed so as to overlap the two first capacitance devices partially in the first direction.

12. The power amplifying device according to claim 7, wherein
each of the plurality of first capacitance devices includes three conductor layers,
the middle conductor layer is connected to the corresponding base electrode, and
the top conductor layer and the bottom conductor layer are connected to each other.

13. The power amplifying device according to claim 11, wherein
each of the plurality of first capacitance devices includes three conductor layers,
the middle conductor layer is connected to the corresponding base electrode, and
the top conductor layer and the bottom conductor layer are connected to each other.

14. The power amplifying device according to claim 7, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

15. The power amplifying device according to claim 11, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

16. The power amplifying device according to claim 6, wherein
each of the plurality of first capacitance devices includes three conductor layers,
the middle conductor layer is connected to the corresponding base electrode, and
the top conductor layer and the bottom conductor layer are connected to each other.

17. The power amplifying device according to claim 6, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

18. The power amplifying device according to claim 1, wherein
each of the plurality of first capacitance devices includes three conductor layers,
the middle conductor layer is connected to the corresponding base electrode, and
the top conductor layer and the bottom conductor layer are connected to each other.

19. The power amplifying device according to claim 18, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

20. The power amplifying device according to claim 1, further comprising:
a plurality of second capacitance devices that are connected to the respective base electrodes of the plurality of bipolar transistors,
wherein
the plurality of second capacitance devices are disposed on an identical side relative to the second direction when viewed from the plurality of bipolar transistors, and
at least one of the plurality of second capacitance devices is disposed so as to overlap a different second capacitance device partially when viewed from the plurality of bipolar transistors in the second direction.

* * * * *